United States Patent
Dolman et al.

[11] Patent Number: 5,740,522
[45] Date of Patent: Apr. 14, 1998

[54] METHOD AND APPARATUS FOR REDUCING RECEIVE BAND TRANSMITTER-CHAIN NOISE FOR A PORTABLE DUPLEX TRANSCEIVER

[75] Inventors: Rodney A. Dolman, Cary; Ross W. Lampe, Raleigh; Xue-Song Zhou, Chapel Hill, all of N.C.

[73] Assignee: Ericsson Inc., Research Triangle Park, N.C.

[21] Appl. No.: 503,027

[22] Filed: Jul. 17, 1995

[51] Int. Cl.$^6$ .................................................. H04B 1/04
[52] U.S. Cl. ....................... 455/113; 455/119; 331/117 D; 331/115
[58] Field of Search ........................ 455/76, 110–114, 455/116, 119, 126, 127; 331/115, 117 D, 177 V, 108 C; 332/130, 135, 136

[56] References Cited

U.S. PATENT DOCUMENTS

| | | |
|---|---|---|
| 3,668,673 | 6/1972 | Adler ........................................ 455/110 |
| 3,775,698 | 11/1973 | Nugent et al. . |
| 3,832,653 | 8/1974 | Nugent et al. . |
| 4,047,110 | 9/1977 | Janning . |
| 4,395,776 | 7/1983 | Naito et al. . |
| 4,481,489 | 11/1984 | Kurby .................................. 455/113 X |
| 5,036,299 | 7/1991 | Dick et al. . |
| 5,109,532 | 4/1992 | Petrovic et al. . |
| 5,187,451 | 2/1993 | Nakamoto et al. . |
| 5,218,325 | 6/1993 | Trelewicz et al. . |
| 5,321,847 | 6/1994 | Johnson, Jr. . |
| 5,396,652 | 3/1995 | Kunimoto ............................ 455/116 X |

FOREIGN PATENT DOCUMENTS

| | | |
|---|---|---|
| 0 421 646 A2 | 4/1991 | European Pat. Off. . |
| 0 450 476 A2 | 10/1991 | European Pat. Off. . |

*Primary Examiner*—Chi H. Pham
*Attorney, Agent, or Firm*—Nixon & Vanderhye PC

[57] ABSTRACT

Reduction of transmitter exciter chain generated noise from the receive bank of a portable/hand-held duplex transceiver is achieved using a high output power, low-noise voltage-controlled-oscillator (VCO) in the transmitter exciter chain. Using this high-power, low-noise oscillator as the RF source in the transmitter exciter chain precludes the need for the conventional buffer/driver amlplifier stage and an associated inter-stage noise filter. Elimination of buffer/driver stage components and bulky inter-stage noise filter components allows complete integration of transmitter exciter chain components resulting in reduced size and cost.

8 Claims, 5 Drawing Sheets

METHOD AND APPARATUS FOR REDUCING RECEIVE BAND TRANSMITTER-CHAIN NOISE FOR A PORTABLE DUPLEX TRANSCEIVER

CROSS-REFERENCES TO RELATED APPLICATIONS

This application is related to copending application Ser. No. 08/395,882 of Xue-Song Zhou entitled "High-Power Low Noise Voltage-Controlled Oscillator", filed Feb. 26, 1995, commonly assigned with the present invention. The disclosure of the above application is incorporated by reference as if expressly set forth herein.

FIELD OF THE INVENTION

This invention relates to portable/hand-held duplex radio frequency (RF) transceivers, and in particular to an improved method and apparatus for reducing transmitter generated noise in the receive frequency band of a duplex transceiver.

BACKGROUND AND SUMMARY OF THE INVENTION

To enhance both the portability and overall utility of any portable radio frequency (RF) transceiver, it is usually desirable to reduce size and increase the power efficiency while avoiding the introduction of noise and degraded performance. Numerous previous attempts to identify and minimize noise sources in RF broadcast communications are known but are not particularly applicable to portable/hand-held duplex radio transceivers. The following is a brief, non-exhaustive listing of patents that describe various aspects of noise production and reduction in radio frequency transmitters and related issues:

U.S. Pat. No. 5,218,325 to Trelewicz et al.
U.S. Pat. No. 4,047,110 to Janning
U.S. Pat. No. 3,775,698 to Nugent et al.
U.S. Pat. No. 3,832,653 to Nugent et al.
U.S. Pat. No. 5,109,532 to Petrovic et al.
U.S. Pat. No. 5,036,299 to Dick et al.
U.S. Pat. No. 5,321,847 to Johnson, Jr.

For example, U.S. Pat. No. 5,218,325 to Trelewicz et al. discloses a low noise-floor oscillator circuit for use in portable RF radios that is relatively small in size and consumes little power. The oscillator is purported to have low noise output but the arrangement requires a buffer/driver amplifier stage that contributes to out-of-band noise as well as thermal noise. U.S. Pat. No. 4,047,110 to Janning pertains to "in-band" noise elimination for broadband transceiving equipment. The arrangement utilizes a high-power, low-noise oscillator as a type of dynamic noise filter connected between the transmitter power amplifier and the antenna to preclude the need to modify internal circuits of existing presently installed broadband transceiving equipment. U.S. Pat. Nos. 3,775,698 and 3,832,653 to Nugent et al. relate to oscillator circuits for producing high-power RF signals with a low level of noise. U.S. Pat. No. 5,109,532 to Petrovic et al. describes elimination of noise and drift incident to up/down conversion in RF transmitters. The remaining references listed above disclose various conventional examples and arrangements for reducing RF oscillator output noise and intermodulation distortion.

In a full duplex radio transceiver one capable of simultaneously transmitting/receiving using two sufficiently separated carrier frequencies, transmitter generated noise in the receive band results in significant degradation of receiver sensitivity. Much of the noise produced by a radio frequency (RF) transceiver is due to sideband noise generated in the transmitter exciter chain. Indeed, the whole process of coupling useful signal power from the output of an "on-frequency" source oscillator or a voltage controlled oscillator (VCO) to the input of the final output power amplifier is a major source of noise (phase noise and AM noise) and degraded performance. Consequently, the "noise-floor" of the transmitter oscillator circuit should be as low as possible.

Receiver sensitivity for a full duplex radio may be determined by first calculating the "noise-floor" of the transceiver and then taking into consideration other noise factors. For example, in a 50 ohm system at 25° C., the sensitivity of a receiver can be determined by the following well know equation:

$$12 \text{ db sinad sensitivity } (dBm) = -174 \ dBm + NF(dB) + C/N(dB) + 10*\log(BW) \quad (1)$$

where, the value "−174 dBm" is the noise produced across a 50 ohm resistor at 25° C.; NF is the "noise figure" of the receiver system in dB; C/N is the carrier-to-noise ratio expressed in dB required to produce 12 dB sinad; and 10*log (BW) is the bandwidth of the system expressed in dB. Any additional noise produced by the transmitter exciter chain in a duplex radio system would modify the above equation and the resulting sensitivity of the receiver would be further degraded—unless the transmitter chain noise can be reduced to kTB or lower.

As depicted in FIGS. 1A–1C, there are three basic conventional transmitter exciter chain configurations presently used in duplex portable/hand-held radios: 1) an "on-frequency" low-power oscillator, the output of which is modulated or unmodulated, buffered, and noise-filtered before power amplification and transmission (as depicted in FIG. 1A); 2) a low-power oscillator, the output of which may be modulated or unmodulated, up/down-converted by the use of a mixer and a second oscillator (which also may be modulated or unmodulated), then buffered, filtered and transmitted (as depicted in FIG. 1B); and 3) a low-power low-frequency oscillator output that is modulated or unmodulated, multiplied, amplified, filtered and transmitted, as depicted in FIG. 1C.

As an example, the noise floor for a conventional 30 kHz bandwidth system (i.e., 30 kHz between frequency channels) would be about −129.2 dBm (i.e., −174 dBm+ 10*log(30 kHz)). Conventional portable/hand-held transmitters have final power amplifier sections with about 28 to 31 dB total gain in two to three stages and require 3 dBm to 7 dBm of input drive power to achieve a 1 Watt output. Accordingly, additional amplification may also be required preceding the final power amplifier section to boost the signal to the required +3 dBm to +7 dBm input drive level. Thus, the final power amplifier noise, by itself, assuming a 3–5 dB input noise figure would be 36 dB (i.e., 5 dB+31 dB) above the noise floor (i.e., −129.2 dBm) or −93 dBm.

A conventional duplexer used in such systems typically provides 40 dB of attenuation to the receive frequencies in the transmit section of the duplexer filter along with 1.5 dB insertion loss to the transmit signal. Receive band noise from the final power amplifier at the antenna terminals is on the order of −133 dBm (i.e., −93 dBm−40 dBm). This level is below the −129.2 dBm noise-floor of the system and therefore causes no appreciable degradation in receiver sensitivity. However, any additional noise contributed by the driver and oscillator section of the transmitter exciter chain must either be filtered prior to the power amplifier or subsequently in the transceiver duplexer filter (not shown).

Filtering after the power amplifier section, for example, by increasing the attenuation to receive band frequencies in the transmitter duplexer filter, increases the insertion loss of the desired transmit signal. Increased insertion loss in the duplexer requires more output power from the power amplifier resulting in shortened battery life in portable radios, increased heat dissipation, and decreased transmitter chain efficiency. Thus, the conventional method to reduce the noise is to precede the power amplifier with an inter-stage filter while keeping the added noise from the driver/ oscillator sections of the transmitter chain at kTB or below.

Typically, a relatively expensive surface acoustic wave (SAW) type filter or ceramic filter must be used as an inter-stage filter. Moreover, these filters are also not well suited for fabrication by present integrated circuit (IC) technology. In fact, current cellular transmitters can be fabricated on a single IC chip, except for the ceramic or SAW inter-stage filter. Consequently, the conventional transmitter exciter chain configurations require costly filtering and final RF power amplifier designs to meet system noise requirements. Therefore, to reduce costs and to integrate the entire transmitter exciter chain on a single IC chip, it is desirable to eliminate the inter-stage filter.

The present invention employs a frequency source or VCO having a low noise, high power output to eliminate the need for a buffer/drive stage amplifier and the associated inter-stage filter. Accordingly, the present invention eliminates bulky and costly inter-stage filtering and reduces transmitter exciter chain noise in the receive band using a single high-power, low-noise, voltage controlled oscillator directly connected to a simplified final power amplifier that uses only one or two stages. This arrangement replaces the low power, oscillator-buffer-filter configuration in conventional transmitter exciter chains and reduces overall complexity of the transceiver.

BRIEF DESCRIPTION OF THE DRAWINGS

These and other features and advantages of the present invention will become more completely understood by referring to the following detailed description of presently preferred exemplary embodiments in conjunction with the FIGURES in which like reference numerals refer to like elements throughout.

DETAILED DESCRIPTION OF THE DRAWINGS

In the following description, for purposes of explanation and not limitation, specific details are set forth, such as particular circuits, circuit components, interfaces, techniques, etc. in order to provide a thorough understanding of the present invention. However, it will be apparent to one skilled in the art that the present invention may be practiced in other embodiments that depart from these specific details. In other instances, detailed descriptions of well known methods, devices, and circuits are omitted so not to obscure the description of the present invention with unnecessary detail.

Figure 1A:
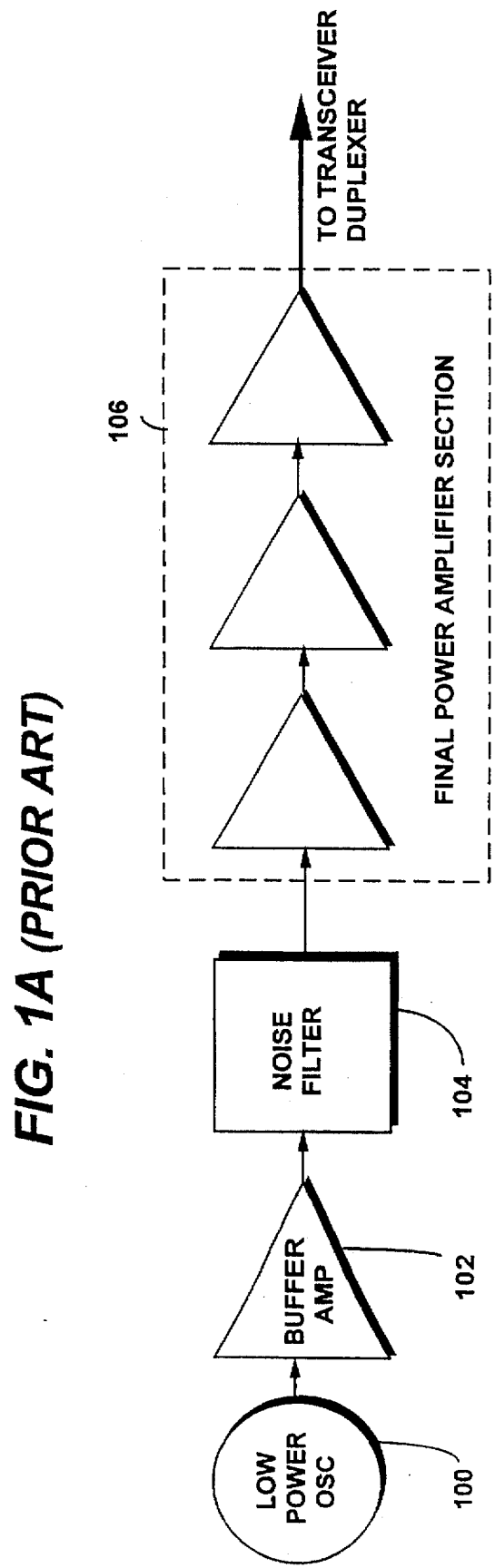
FIGS. 1A–1C are functional block diagrams illustrating conventional transmitter exciter chain arrangements.
Figure 1B:
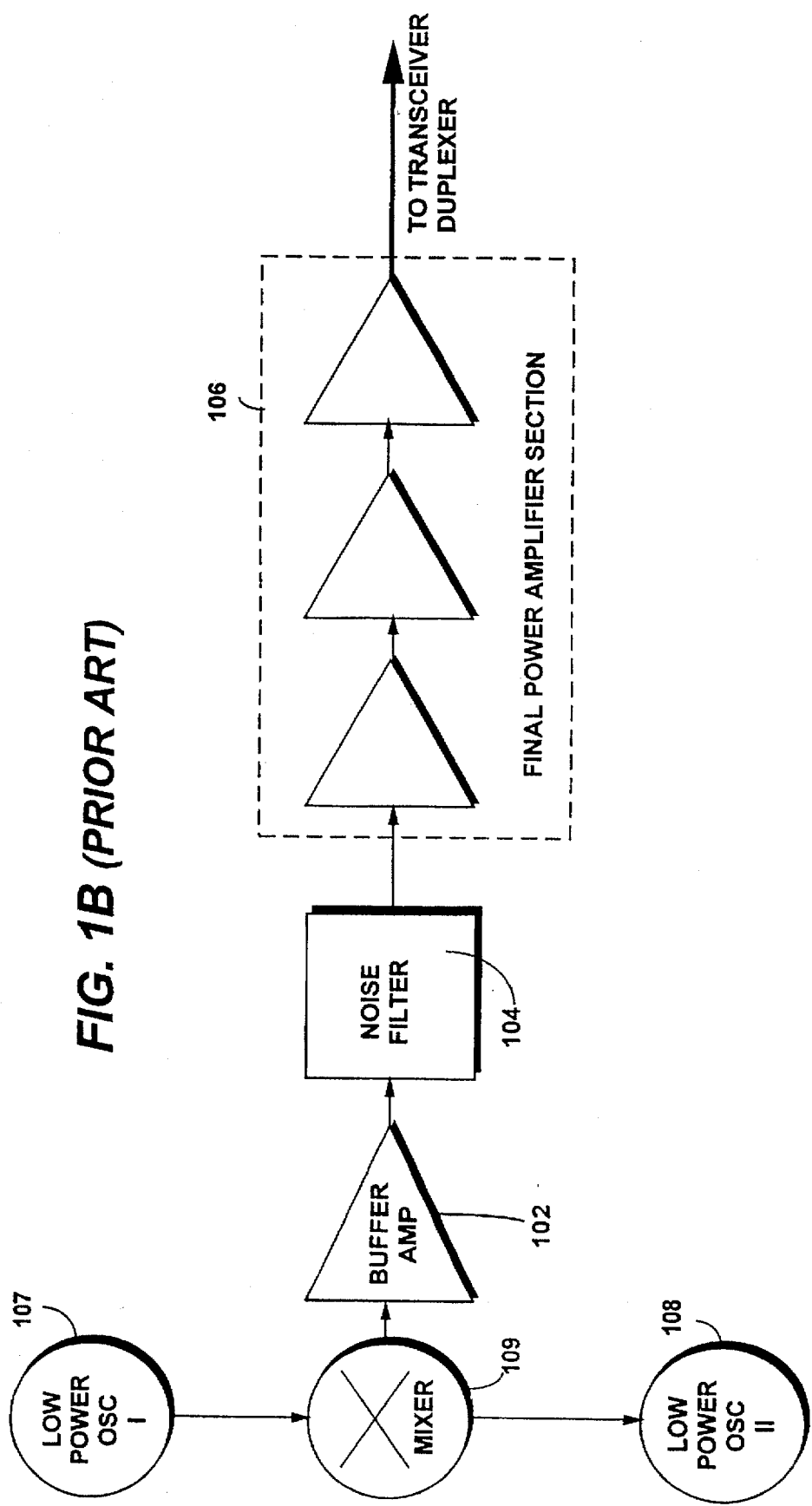
Figure 1C:
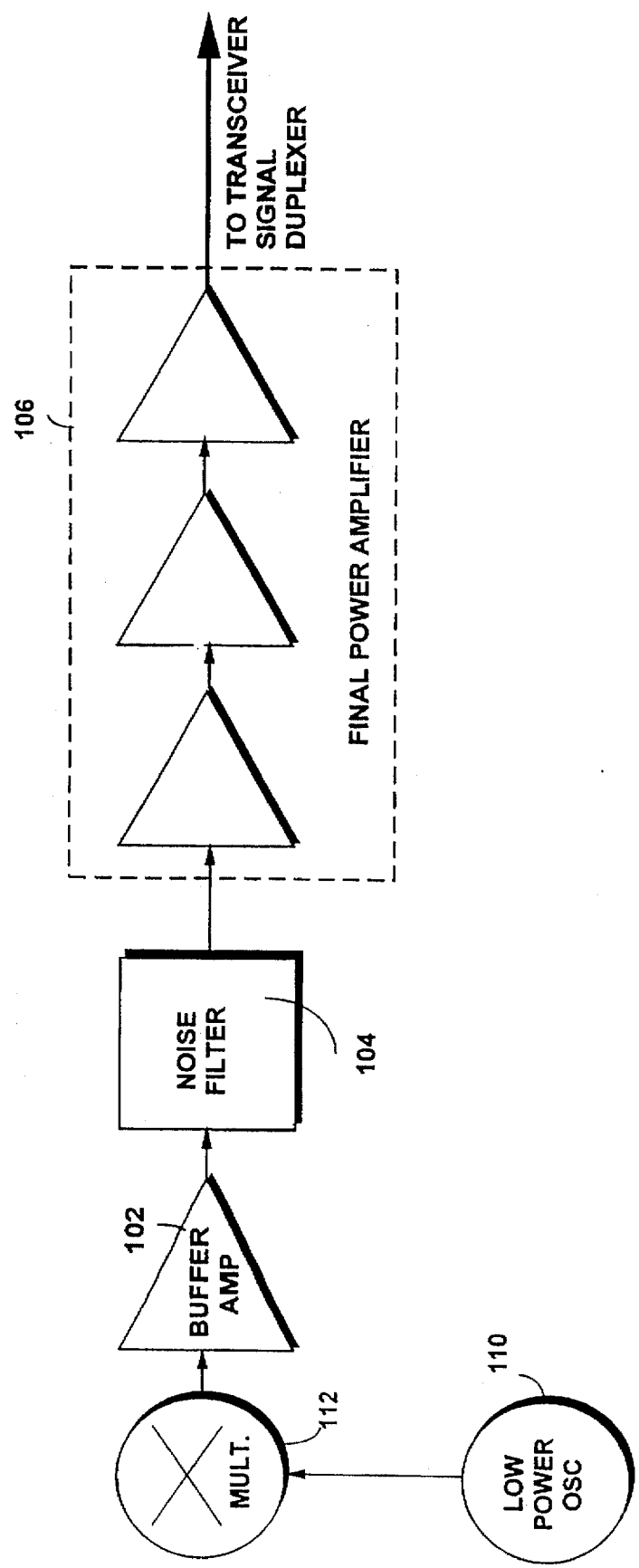

FIGS. 1A–1C illustrate several conventional transmitter exciter chain configurations. For example, in FIG. 1A a low-power "on-frequency" oscillator produces a signal that is modulated, buffered, and noise-filtered before power amplification and transmission. FIG. 1B shows a low-power oscillator the output of which is modulated, up/down converted by the use of a mixer and a second oscillator, (which may also be modulated or unmodulated), then buffered, filtered and transmitted. FIG. 1C depicts yet a third scheme in which the modulated (or unmodulated) output of a low-power low-frequency oscillator is frequency multiplied (×N), amplified and filtered before final power amplification and transmission.

Referring to FIG. 1A, one conventional RF transmitter exciter chain often used in cellular radio telephone or their portable terminal applications consists of a voltage controlled oscillator (VCO) 100 that generates a low-power carrier signal, a buffer/driver amplifier stage 102, an inter-stage noise filter 104 that may be either a ceramic or a surface acoustic-wave (SAW) device, and a power amplifier section 106 for boosting the power of the carrier to an appropriate level for transmission. With this configuration, buffer/driver amplifier 102 is needed to raise the VCO's low power output (typically 0 dBm or less) to a level adequate for input to the power amplifier, e.g., +3 to +7 dBm. Inter-stage noise filter 104 is then needed to remove noise generated outside the spectral band of interest (i.e., outside the transmission channel bandwidth and within the receive band of the radio) that is amplified by buffer/driver 102. Otherwise, the out-of-transmission band noise amplified by buffer/driver stage 102 is passed to power amplifier section 106, and the amplified out-of-band noise power would be almost impossible to remove with commercially available filters suitable for portable radios.

In a second type of conventional transmitter exciter chain configuration depicted in FIG. 1B, the output of a low power, low-frequency offset-oscillator 107 and low-power, high-frequency oscillator 108 are mixed to achieve a desired transmit frequency. The composite output of up-converting mixer 109 includes the two primary mixing frequencies, the sum and difference of the primary mixing frequencies, additional mixing products and added noise. The sum or difference output of the mixer is usually the desired transmit frequency and contains additional noise components above kTB. This noisy signal is then amplified by buffer amplifier 102, filtered by an inter-stage (SAW) noise and spurious filter 104 and applied to the input of final power amplifier section 106.

In the third type of conventional transmitter exciter chain configuration, as depicted in FIG. 1C, the output of low-power oscillator 110 is first up-converted in frequency by multiplier 112. However, the output of frequency multiplier 112 also contains unwanted noise components above kTB. Consequently, this noise is amplified by buffer 102 along with the desired signal and must be filtered by inter-stage filter 104 before applied to final power amplifier section 106.

Figure 2:
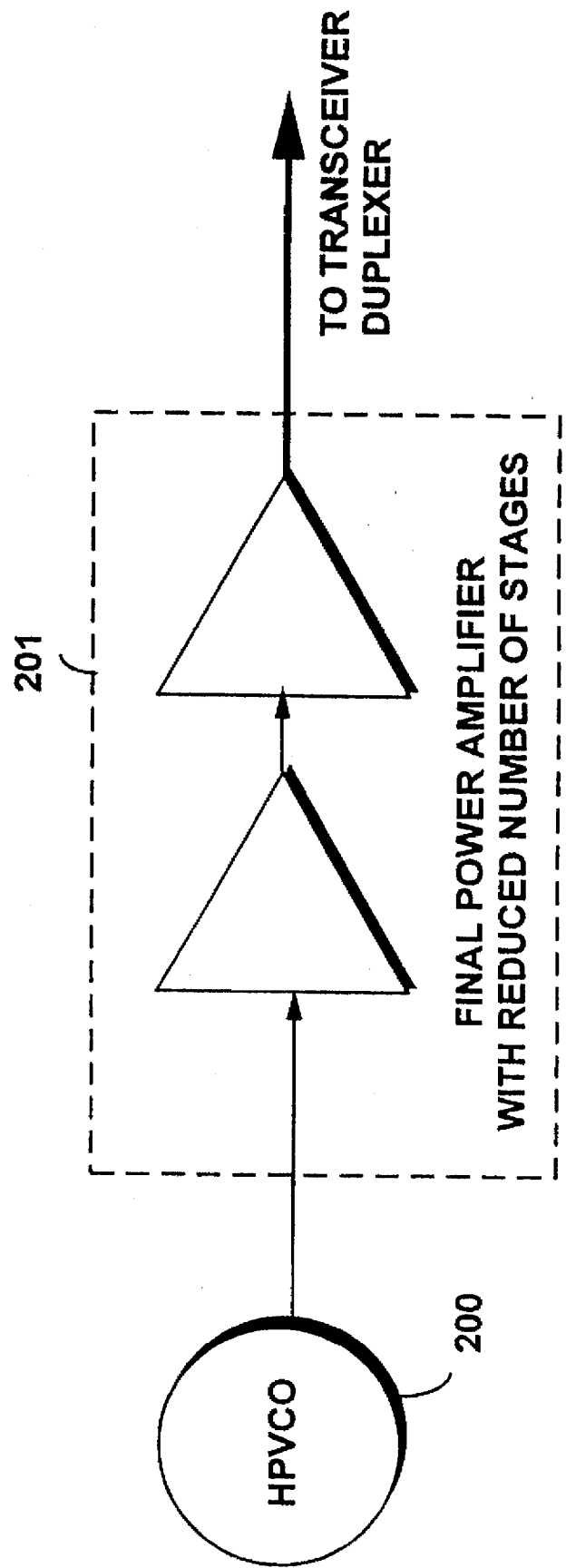
FIG. 2 is a block diagram showing the transmitter exciter chain arrangement of the present invention.

In accordance with the present invention, as depicted in FIG. 2, the need for a buffer/driver stage and a inter-stage noise clean-up filter preceding the final power amplifier section is eliminated, thus reducing cost and complexity of the conventional duplex transmitter signal-chain. Specifically, a high-power low-noise "on-frequency" voltage controlled oscillator, HPVCO 200, is used in conjunction with a reduced final amplifier stage 201. The relatively high output power of HPVCO 200 (e.g., preferably on the order of +15 dBm or greater) (1) precludes the need for an inter-stage noise filter, (2) permits a reduction in amplification stages of final power amplifier section 102 to a single or double stage having (e.g., two stages having a 15 dB total gain), and (3) significantly lowers total transmitter exciter chain noise produced in the receive band because of the reduced gain in the reduced stage final power amplifier section 102.

HPVCO 200 is preferrably combined and fabricated with final power amplifier section 201 as a single integrated circuit to reduce cost and components without sacrificing performance. Although HPVCO 200 could be implemented using discrete components, such an implementation does not reduce the complexity of the transmitter chain as much as the fully integrated approach.

Final power amplifier stage 201 has about +15 dB gain with a maximum −5 dB noise figure. The noise appearing at the transceiver transmitter duplex filter section output (not shown) in the receive band and in a 30 kHz bandwidth would be the sum of the HPVCO 200 noise floor (i.e., NF=15 dB=−159 dBm/Hz=126×10$^{-18}$ mwatts/Hz), the input noise (i.e., NF=5 dB=−169 dBm/Hz=12.6×10$^{-18}$ mwatts/Hz) of the final power amplifier stage 201 multiplied by the final power amplifier stage 201 gain (+15 dB), the transmitter duplex filter section attenuation to receive frequencies (40 dB) plus the correction for the 30 kHz bandwidth (44.7 dB).

$$\text{Noise} = [10 * \log(126 \times 10^{-18} + 12.6 \times 10^{-18})] + 15 - 40 + 44.7 = -138.9 \ dBm$$

The 10 dB margin to the −129.2 dBm system noise floor may be used in many ways. For example, one way is to increase transmitter efficiency by reducing duplexer insertion loss in the transmit section. This could be done by increasing the bandwidth of the transmit section of the duplexer thus reducing received band attenuation. The increased efficiency could also result in lower battery cost since the total current consumption during transmit would be less. Another is to lower the radio cost by reducing the complexity of the duplexer which would reduce received band attenuation in the transmitter section of the duplexer. However, any of these options needs to be implemented carefully to ensure that requirements for transmit noise in the receive band are met.

Figure 3:
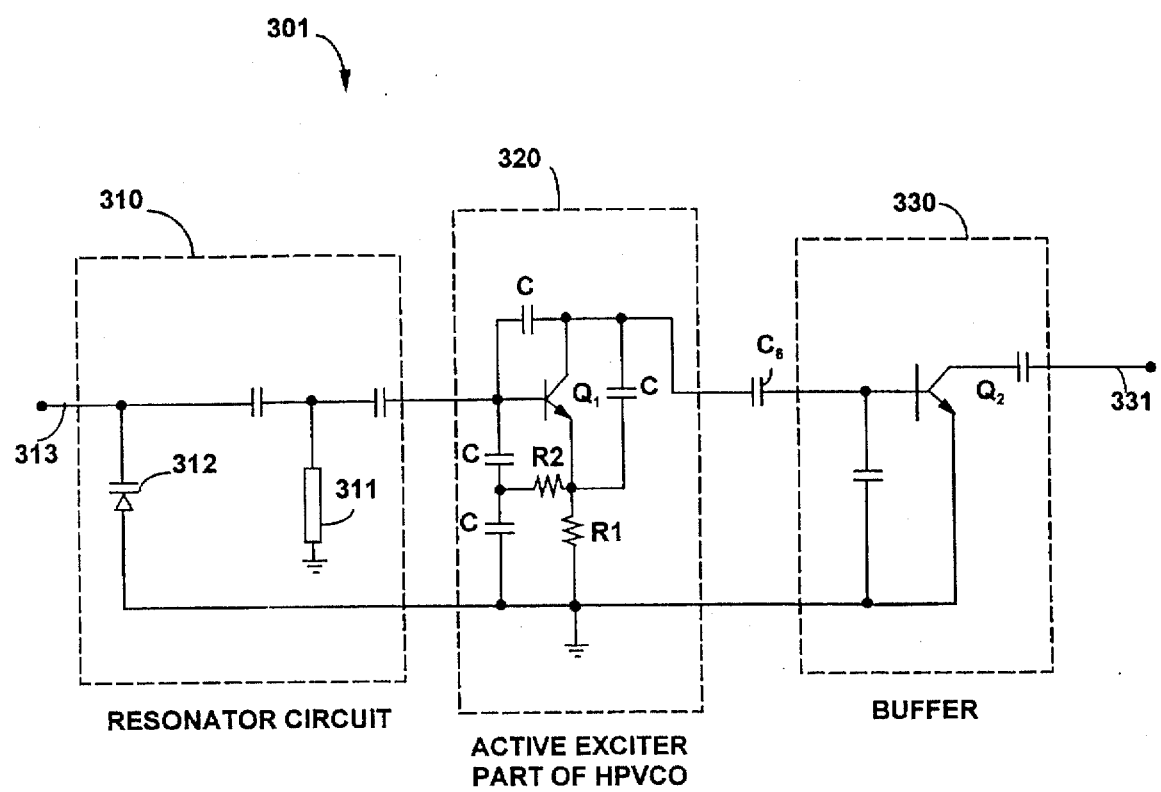
FIG. 3 is an example electrical schematic diagram of the type of high-power low-noise voltage-controlled oscillator used in accordance with applicant's invention.

An example of a type of radio frequency source oscillator having high output power and low noise in accordance with the present invention is depicted in FIG. 3. A preferred high-power, low-noise, voltage-controlled-oscillator (HPVCO) circuit 301 basically consists of low-Q resonator circuit 310, an active exciter circuit 320 connected to resonator circuit 310 that includes at least one transistor Q1 connected in a Colpitts configuration, and a single transistor buffer amplifier 330 connected to the output of active exciter circuit 320 for isolating the resonator 310 and exciter 320 from output loads. In accordance with the present invention, all of the circuitry of HPVCO 301 is preferably fabricated on a single integrated chip.

Resonator 310 includes such components as microstrip line 311 and varactor 312 which are also preferably of solid-state fabrication. A bias voltage applied across varactor 312, introduced for example via a control signal at terminal 313, controls the frequency of the RF output signal generated by HPVCO circuit 301. It will be appreciated that the conductive coupling path between resonator circuit 310 and active exciter 320 should be relatively weak in order to increase the Q-factor of resonator 310.

Active exciter 320 includes capacitors C connected in parallel with junction capacitances of transistor Q1. Each capacitor C has a value greater than a value of the respective junction capacitance with which it is connected in parallel. A first resistance R1 provides negative feedback at low frequencies. Two (or more) of capacitors C enhance feedback in exciter 320 at high frequencies, suppress positive feedback at low frequencies, and compensate for changes in the junction capacitances of Q1. Exciter circuit 320 may further include a second resistance R2 for controlling gain when oscillation begins. Moreover, exciter circuit 320 may include a plurality of Colpitts configuration transistors connected in parallel for reducing the total amount of d.c. current passing through each respective parallel transistor to reduce the noise.

Buffer amplifier circuit 330 is a linear amplifier and preferably consists of only a single a transistor (Q2). Exciter circuit 320 and single transistor buffer amplifier 330 are connected by an appropriate capacitance (C6) for reducing the coupling between exciter 320 and the buffer amplifier 330.

Although the above described high-power low-noise voltage-controlled oscillator may be realized in various formats, the component size, structure, power consumption, etc. as contemplated for the present invention should preferably be of a design that is physically and commercially feasible for use in portable/hand-held transceivers. One such high-power low-noise voltage-controlled oscillator that can be used is described in detail in the above mentioned copending application of Xue-Song Zhou, Ser. No. 08/395,882, filed Feb. 26, 1995, incorporated herein by reference.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A transmitter exciter chain arrangement in a portable duplex radio transceiver having reduced radio frequency noise generated in the transceiver radio frequency receive band, comprising:

a low-noise, high output power radio frequency (RF) oscillator connected directly to an RF power amplifier wherein said oscillator circuit includes an active exciter circuit and said exciter circuit comprises at least one transistor, said transistor having a capacitor coupled in parallel with a junction capacitance inherent to each semiconductive junction of said transistor to reduce transmitter sideband noise occurring at receive-band frequencies.

2. The transmitter exciter chain arrangement of claim 1 wherein said low-noise, high output power radio frequency oscillator further comprises:

a resonator circuit;

said at least one transistor is coupled in a Colpitts oscillator configuration with respect to said resonator circuit; and a buffer amplifier circuit coupled to said active exciter circuit.

3. The transmitter exciter chain arrangement of claim 1 wherein electrical components for said low-noise, high output power voltage-controlled radio frequency oscillator are fabricated on a single integrated chip along with electrical components for said RF power amplifier.

4. The transmitter exciter chain arrangement of claim 1 wherein said low-noise, high output power radio frequency oscillator is a voltage-controlled oscillator.

5. In a duplex radio transceiver, the combination comprising:

a high output power, low-noise voltage-controlled radio frequency (RF) source oscillator, said oscillator circuit including an active exciter circuit and said exciter circuit comprising at least one transistor arranged in a Colpitts oscillator configuration, wherein said transistor having an inherent junction capacitance associated with each semiconductive junction therein includes a capacitor coupled in parallel with each junction capacitance to reduce transmitter sideband noise occurring at receive-band frequencies, and an RF power amplifier circuit having a low-level RF signal input and an amplified RF signal output; wherein a high-power, low-noise RF output signal of said RF source oscillator is provided directly to an input of said RF power amplifier output stage.

6. The duplex radio transceiver of claim 5 wherein said low-noise, high output power voltage-controlled radio frequency oscillator further comprises:

a resonator circuit;

said active exciter circuit comprising one or more Colpitts configuration transistors connected in parallel for reducing an amount of current passing through each respective parallel transistor to further reduce transmitter sideband noise occurring in the receive band; and a buffer amplifier circuit coupled to said active exciter circuit.

7. The duplex radio transceiver of claim 5 wherein electrical components for said high output power, low-noise voltage-controlled radio frequency oscillator are fabricated on a single integrated chip along with electrical components for said RF power amplifier.

8. In a portable radio frequency transceiver including a radio transmitter and a radio receiver, said transmitter having a low-noise, high output power radio frequency (RF) voltage controlled oscillator fabricated on a single integrated semiconductor chip that includes an active exciter circuit comprising at least one transistor arranged in a Colpitts oscillator configuration, a method for reducing exciter generated transmitter sideband noise from the receive band of said radio receiver, comprising the steps of:

providing an additional capacitor coupled in parallel with each junction capacitance of said transistor to reduce transmitter sideband noise generated at receive-band frequencies of said radio receiver; and providing an output of said low-noise, high output power radio frequency (RF) voltage controlled oscillator directly to a final RF power output stage of said transmitter.

* * * * *